US007071569B2

(12) United States Patent
Ho et al.

(10) Patent No.: US 7,071,569 B2
(45) Date of Patent: Jul. 4, 2006

(54) ELECTRICAL PACKAGE CAPABLE OF INCREASING THE DENSITY OF BONDING PADS AND FINE CIRCUIT LINES INSIDE A INTERCONNECTION

(75) Inventors: Kwun-Yao Ho, Taipei Hsien (TW); Moriss Kung, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/709,954

(22) Filed: Jun. 9, 2004

(65) Prior Publication Data

US 2005/0035464 A1 Feb. 17, 2005

(30) Foreign Application Priority Data

Aug. 14, 2003 (TW) .............................. 92122342 A

(51) Int. Cl.
*H01L 23/48* (2006.01)
*H01L 29/40* (2006.01)
(52) U.S. Cl. .............................. 257/778; 257/E23.063; 257/E23.062; 257/E23.011; 257/E23.006; 257/668; 257/774; 257/773; 257/737; 257/738; 257/734; 257/691; 257/698; 257/693; 257/692; 257/678
(58) Field of Classification Search ................ 257/778, 257/779, 734, 738, 737, 700, 701, 712, 713, 257/717, 675, 696, 690–693, 773, 774, 668, 257/678, E23.063, E23.062, E23.011, E23.006
See application file for complete search history.

(56) References Cited

U.S. PATENT DOCUMENTS

| 6,365,975 B1 * | 4/2002 | DiStefano et al. .......... 257/777 |
| 6,617,681 B1 * | 9/2003 | Bohr .......................... 257/700 |
| 6,770,971 B1 * | 8/2004 | Kouno et al. ................ 257/734 |
| 6,784,554 B1 * | 8/2004 | Kajiwara et al. ............ 257/778 |
| 6,841,862 B1 * | 1/2005 | Kikuchi et al. ............. 257/680 |
| 6,861,757 B1 * | 3/2005 | Shimoto et al. ............. 257/773 |
| 6,872,589 B1 * | 3/2005 | Strandberg et al. ......... 438/106 |
| 6,882,045 B1 * | 4/2005 | Massingill et al. ......... 257/724 |
| 2004/0090756 A1 * | 5/2004 | Ho et al. ..................... 361/767 |
| 2004/0155337 A1 * | 8/2004 | Strandberg et al. ......... 257/738 |
| 2005/0133930 A1 * | 6/2005 | Savastisuk et al. ......... 257/774 |
| 2005/0136634 A1 * | 6/2005 | Savastiouk et al. ......... 438/597 |
| 2005/0146049 A1 * | 7/2005 | Kripesh et al. ............. 257/776 |

* cited by examiner

*Primary Examiner*—Alexander Oscar Williams
(74) *Attorney, Agent, or Firm*—Jainq Chyun IP Office

(57) ABSTRACT

An electrical package and manufacturing method thereof is provided. A high stiffness, high electrical conductivity, low coefficient of thermal expansion and high thermal conductivity support substrate is used as an initial layer for building the package. A multilayer interconnection structure is formed over the support substrate. Thereafter, a plurality of openings is formed over the support substrate. The openings expose a plurality of bonding pads on a bottom surface of the multi-layer interconnection structure. An electronic device is set up over the multi-layer interconnection structure. Contacts are formed inside the opening over the bonding pads.

12 Claims, 8 Drawing Sheets

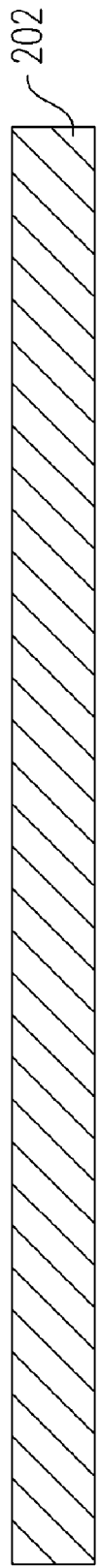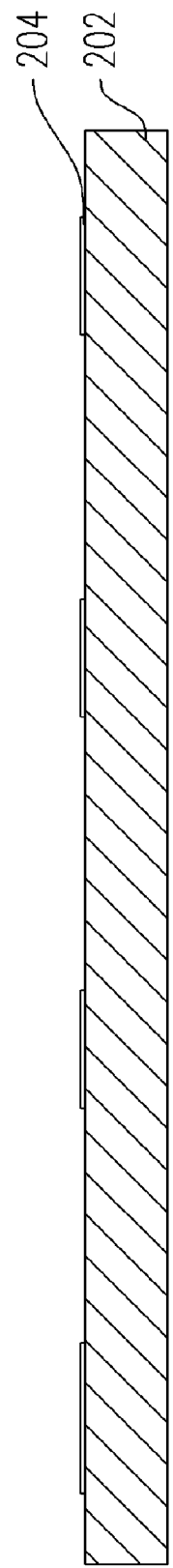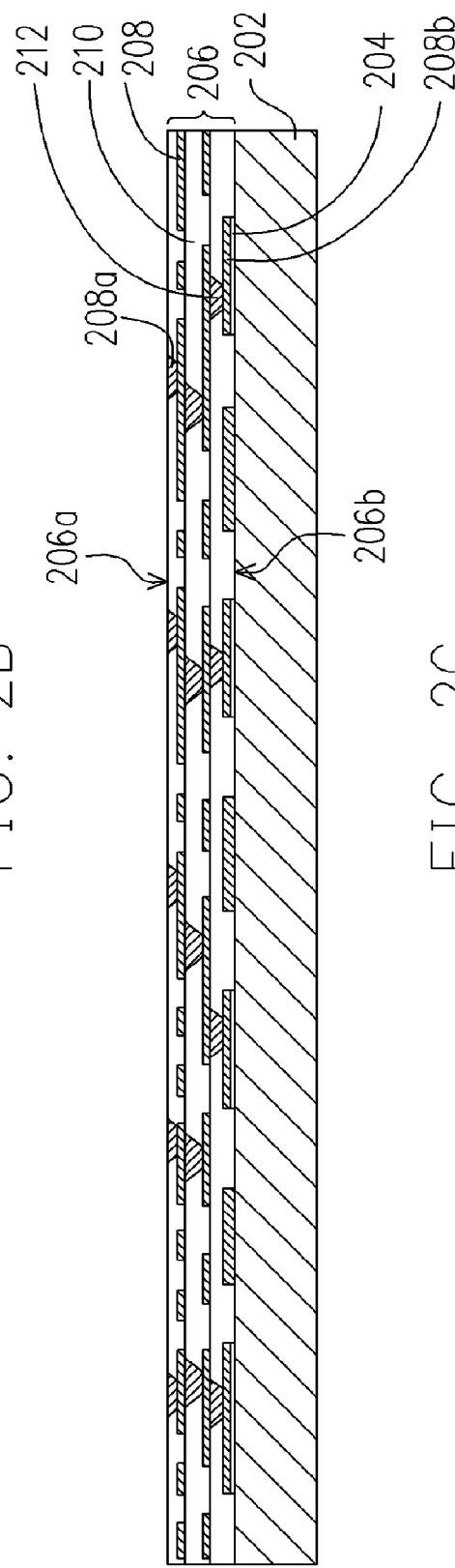

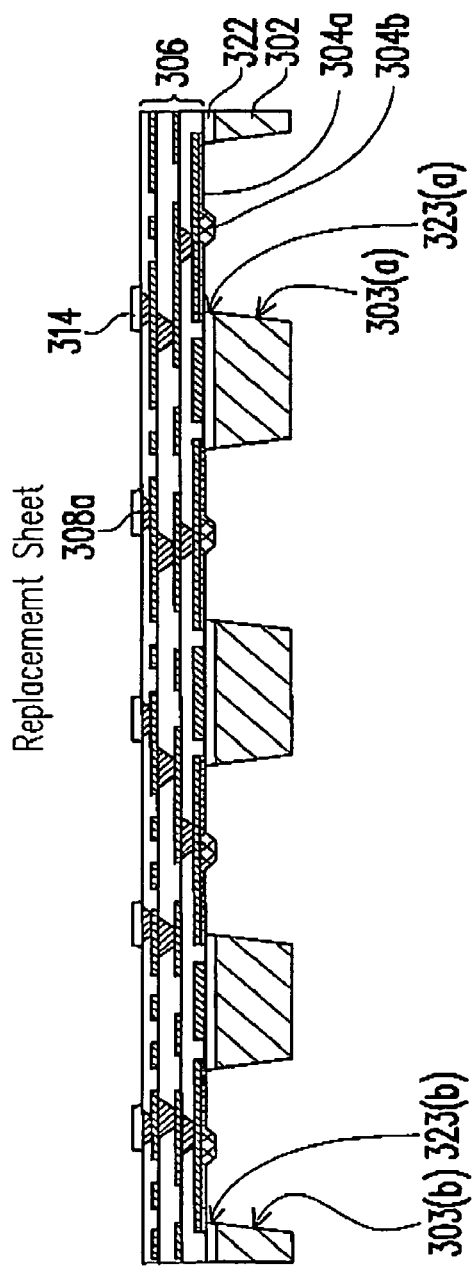
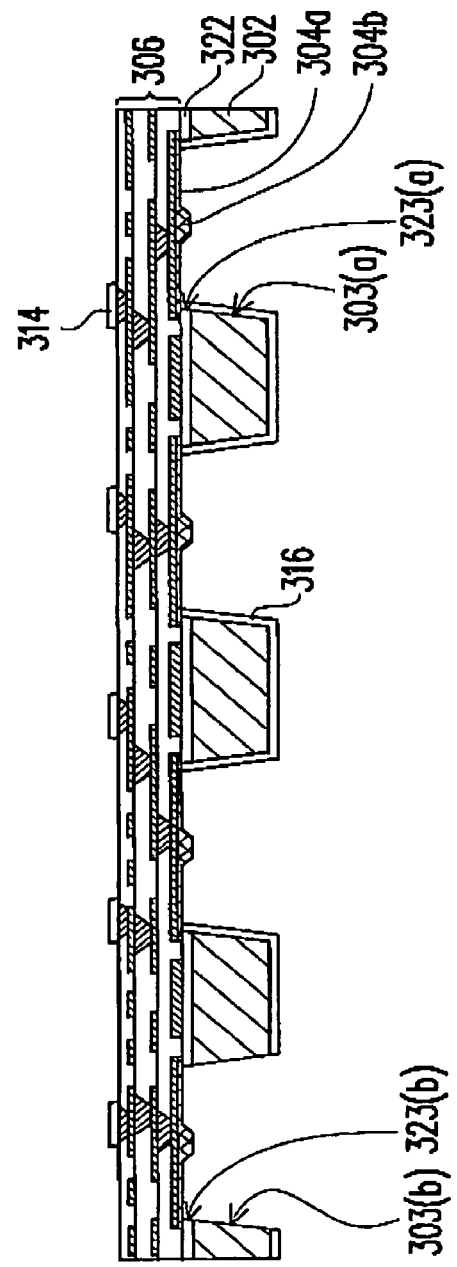
FIG. 4E
FIG. 4F

ND FINE CIRCUIT LINES INSIDE A
ELECTRICAL PACKAGE CAPABLE OF INCREASING THE DENSITY OF BONDING PADS AND FINE CIRCUIT LINES INSIDE A INTERCONNECTION

CROSS REFERENCE TO RELATED APPLICATIONS

This application claims the priority benefit of Taiwan application serial no. 92122342, filed Aug. 14, 2003.

BACKGROUND OF INVENTION

1. Field of the Invention

The present invention relates to an electrical package and manufacturing method thereof. More particularly, the present invention relates to an electrical package having a support substrate fabricated from a conductive material and manufacturing method thereof.

2. Description of the Related Art

Flip chip interconnect technology is a packaging technique for connecting a die to a carrier electrically. To form a flip chip package, an array of die pads is formed on the active surface of a die and then bumps are attached to the respective die pads. Thereafter, the die is flipped over such that the bumps are aligned and bonded to the bump pads on the surface of a carrier. Furthermore, the carrier has internal circuits for connecting with an external electronic device. Hence, the die can be electrically connected to the external device through the bumps and internal circuits inside the carrier. Since the flip chip technology can produce a high pin count chip package with a smaller package size and a shorter signal path length, it has been widely adopted in the semiconductor manufacturing industry. The most common types of chip packages that can be produced using the flip chip technology include the flip-chip/ball grid array (FC/BGA) and the flip-chip/pin grid array (FC/PGA), for example.

FIG. 1 is a schematic cross-sectional view of a conventional flip chip ball grid array electrical package. The electrical package 100 in FIG. 1 comprises a substrate 110, a plurality of bumps 120, a die 130 and a plurality of solder balls 140. The substrate 110 has a top surface 112 and a bottom surface 114. Furthermore, the substrate 110 has a plurality of bump pads 116a and a plurality of ball pads 116b thereon. The die 130 has an active surface 132 and a backside 134. The active surface 132 of the die 130 refers to the surface with the most active devices (not shown). The die 130 also has a plurality of die pads 136 on the active surface 132 serving as a medium for outputting signals from the die 130. The bump pads 116a on the substrate 110 are distributed to correspond with the position of the die pads 136. Each bump 120 is electrically and structurally connected to one of the die pads 136 on the die 130 and a corresponding bump pad 116a on the substrate 110. The solder balls 140 are attached to various solder pads 116b for connecting to an external electrical device both electrically and structurally.

In the conventional process, the circuits inside the substrate 110 and contact points 116a, 116b on the exposed surface of the substrate are formed before assembling the die 130 to the substrate 110. Thereafter, an underfill layer 150 is dispensed into the space between the top surface 112 of the substrate 110 and the active surface 132 of the die 130. The underfill layer 150 not only protects the bump pads 116a, the die pads 136 and the bumps 120, but also buffers any stress between the substrate 110 and the die 130 due to a mismatch in thermal expansion coefficients. In brief, the die pads 136 on the die 130 and the bump pads 116a on the substrate 110 are both electrically and structurally connected through the bumps 120. The bump pads 116a and the solder ball pads 116b on the bottom surface 114 are electrically connected via the internal circuits within the substrate 110. Finally, the solder ball pads 116b and an external device are connected electrically and structurally via the solder balls 140.

To produce high-density circuits within the substrate, a build-up method is often deployed to form a circuit layer on the surfaces of a dielectric core and then using a plated through hole (PTH) to connect the two circuit layers electrically. However, because a substrate having a thin dielectric core is vulnerable to warping by heat, the dielectric core must have a sufficient thickness to provide structural stiffness for withstanding warping stress. This renders any further reduction of the thickness of the dielectric core difficult.

Conventionally, a plated through hole is formed by laser-drilling the dielectric core form a fine hole. Thereafter, an electroplating operation is performed to coat a metallic layer over the interior wall of the hole so that the circuit layers on each side of the dielectric core are electrically connected. However, drilling with a laser is quite an expensive operation, thereby increasing the cost of fabricating the substrate. Moreover, the conventional fabrication method can no longer reduce the diameter of the plated through hole any further. In other words, the conventional method of forming plated through holes in a dielectric core has become a bottleneck for increasing the circuit density within the substrate.

SUMMARY OF INVENTION

Accordingly, one object of the present invention is to provide an electrical package and manufacturing method thereof capable of increasing the density of bonding pads and fine circuit lines inside a multi-layer interconnection structure, lowering the production cost while improving the electrical performance of the package.

To achieve these and other advantages and in accordance with the purpose of the invention, as embodied and broadly described herein, the invention provides an electrical package. The electrical package at least comprises a multi-layer interconnection structure, at least an electronic device and a support substrate. The multi-layer interconnection structure has a top surface and a bottom surface. Furthermore, the multi-layer interconnection structure has an inner circuit with a plurality of bonding pads. The bonding pads are located on the bottom surface of the multi-layer interconnection structure. In addition, the electronic device is disposed on the top surface of the multi-layer interconnection structure but electrically connected to the inner circuit within the multi-layer interconnection structure. The support substrate is fabricated using a conductive material. Furthermore, the support substrate is disposed on the bottom surface of the multi-layer interconnection structure. The support substrate also has a plurality of openings, and each opening exposes one of corresponding bonding pads.

This invention also provides a method of forming an electrical package. First, a support substrate fabricated using a conductive material is provided. Thereafter, a multi-layer interconnection structure is formed on the support substrate. The multi-layer interconnection structure encloses an inner circuit with a plurality of bonding pads located at the junction interface between the multi-layer interconnection structure and the support substrate. A plurality of openings that exposes various bonding pads are formed over the support substrate. At least an electronic device is disposed on the surface of the multi-layer interconnection layer far away from the support substrate. The electronic device is electrically connected to the inner circuit within the muiti-layer interconnection structure.

This invention uses a support substrate with high stiffness, high electrical conductivity, high thermal conductivity and low coefficient of thermal expansion (CTE) to serve as a base layer for building a multi-layer interconnection structure. Thereafter, a plurality of openings that exposes a multiple of bonding pads on the bottom surface of the multi-layer interconnection structure are formed in the support substrate. An electronic device is formed over the multi-layer interconnection layer and contacts are formed inside the openings above the bonding pads. Consequently, this invention effectively improves the electrical performance and the heat-dissipating capacity and reduces overall thickness of the electrical package so that the package can be further miniaturized.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A through 2G are schematic cross-sectional views showing the progression of steps for fabricating an electrical package according to a first preferred embodiment of this invention.

FIGS. 4A through 4H are schematic cross-sectional views showing the progression of steps for fabricating an electrical package according to a second preferred embodiment of this invention.

DETAILED DESCRIPTION

Figure 1:
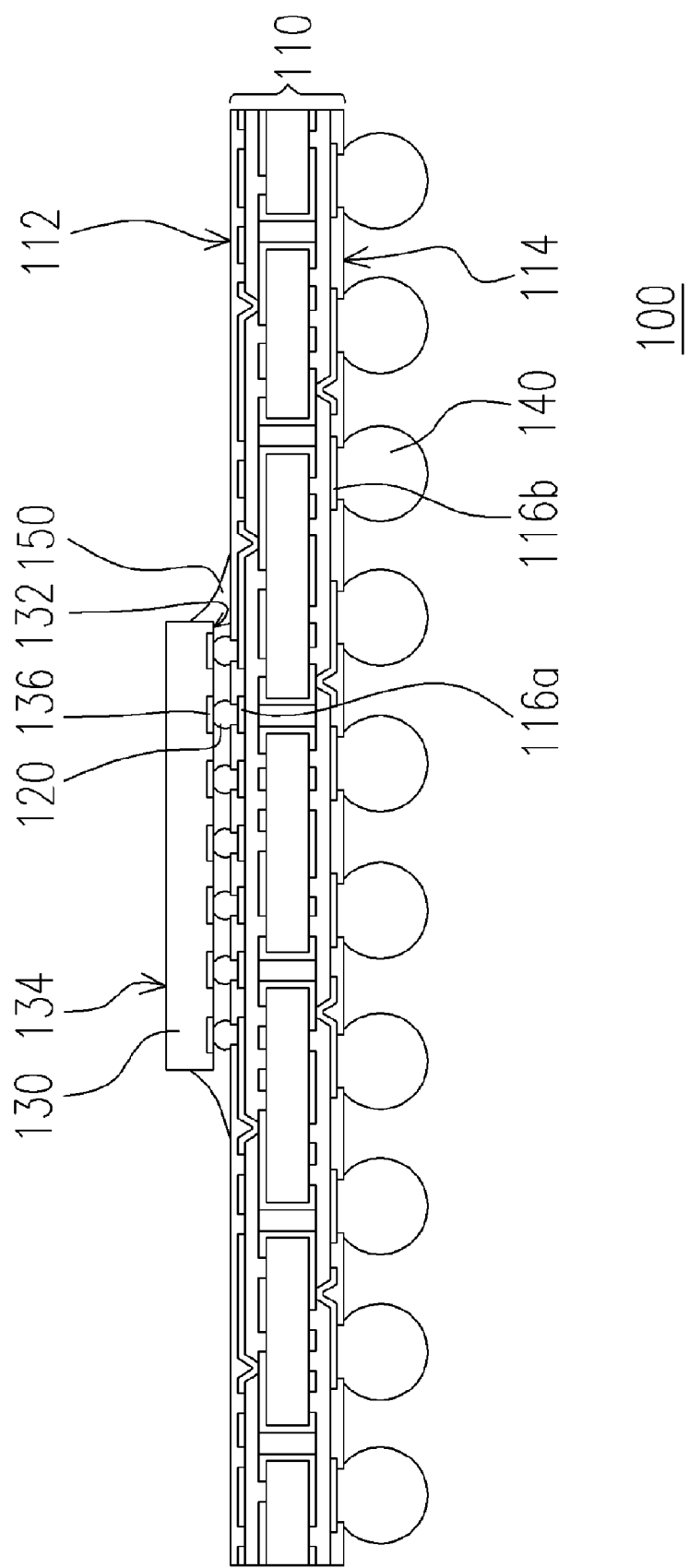
FIG. 1 is a schematic cross-sectional view of a conventional flip chip ball grid array electrical package.

Reference will now be made in detail to the present preferred embodiments of the invention, examples of which are illustrated in the accompanying drawings. Wherever possible, the same reference numbers are used in the drawings and the description to refer to the same or like parts.

Figure 2D:
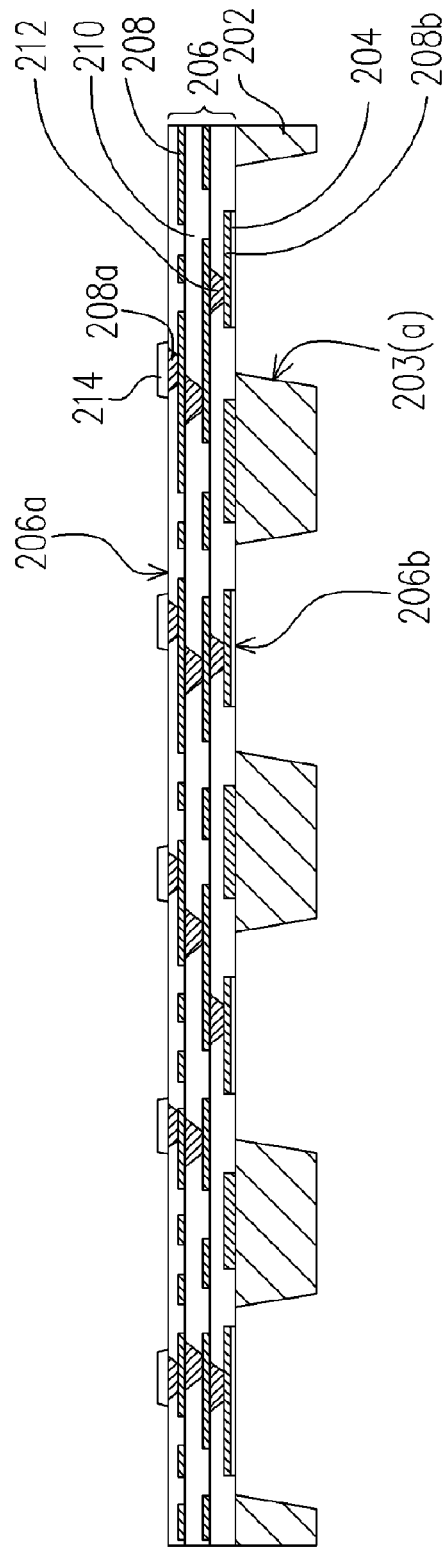

FIGS. 2A through 2G are schematic cross-sectional views showing the progression of steps for fabricating an electrical package according to a first preferred embodiment of this invention. As shown in FIG. 2A, a support substrate 202 fabricated using a high stiffness, electrical conductivity, thermal conductivity and a low coefficient of thermal expansion (CTE) material is provided. Material constituting the support substrate 202 includes iron, cobalt, nickel, copper, aluminum, titanium, tungsten, zirconium, chromium, an alloy of the above, AlSi, or AlSiC. Furthermore, the support substrate 202 must have a high degree of surface planarity to facilitate the subsequent fabrication of fine circuits.

As shown in FIG. 2B, a patterned barrier layer 204 is formed over the support substrate 202. The barrier layer 204 is fabricated using a metallic material such as gold.

As shown in FIG. 2C, a multi-layer interconnection structure 206 is formed over the support substrate 202 to cover the barrier layer 204. The multi-layer interconnection structure 206 comprises a plurality of circuit layers 208, at least a dielectric layer 210 and a plurality of conductive vias 212. The circuit layers 208 are sequentially stacked over the support substrate 202. Each dielectric layer 210 is positioned between two neighboring circuit layers 208. The conductive vias 212 pass through one of the dielectric layers 210 to connect at least two circuit layers 208. The circuit layers 208 and the conductive vias 212 together form a network of inner circuits. The inner circuits form a plurality of bonding pads 208a located on the top surface 206a of the multi-layer interconnection structure 206. Furthermore, the inner circuits forms a plurality of bonding pads 208b located on the bottom surface 206b of the multi-layer interconnection structure 206. The bonding pads 208a may be respectively formed with a portion of the circuit layers 208 or a portion of the conductive vias 212. In FIG. 2C, the bonding pads 208a are respectively formed with a portion of the conductive vias 212. In addition, the circuit layers 208 are fabricated from a metallic material such as copper, aluminum or an alloy of the two. The dielectric layer 210 is fabricated using a dielectric material such as silicon nitride, silicon oxide or epoxy resin.

If the inner circuits within the multi-layer interconnection structure 206 are formed in an electroplating operation, the support substrate 202 may directly provide a conventional plating line function. In other words, the support substrate 202 may be directly connected to a power source that provides the plating current.

In this invention, a liquid crystal display panel or integrated circuit fabricating techniques can be also deployed to produce the multi-layer interconnection structure 206 over the support substrate 202. Hence, the inner circuit can have a line width and pitch between 1 m to 50 µm, most probably from one to a few micrometers. Compared with a conventional organic dielectric substrate 110 as shown in FIG. 1, the multi-layer interconnection structure 206 according to this invention has a higher bonding pads and circuit line density. Moreover, it is possible to dispose a plurality of inner circuit connected passive components (not shown) embedded within the multi-layer interconnection structure 206 or mounted on the top surface 206a when the multi-layer interconnection structure 206 is formed.

As shown in FIG. 2D, a portion of the support substrate 202 is removed by etching to form a patterned support substrate 202 with a plurality of openings 203. The openings 203 respectively expose the bonding pads 208b indirectly through the barrier layers 204. Note that the purpose of having a barrier layer 204 is to prevent the removal of a portion of the inner circuits above the barrier layer 204 when the support substrate 202 is patterned. Furthermore, a pre-solder bump 214 (or a bump) may also be formed over the bonding pad 208a to facilitate flip chip bonding before the electronic device 218 is attached to the top surface 206a of the multi-layer interconnection structure 206.

Figure 2E:
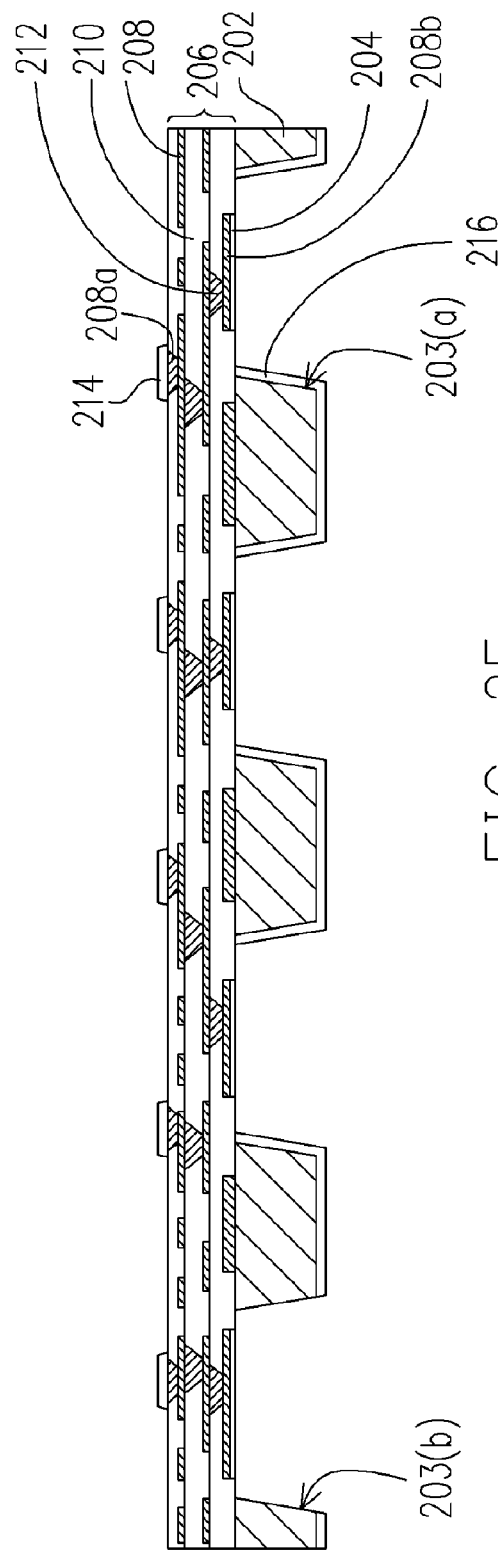

As shown in FIG. 2E, an insulation layer 216 is formed over the interior sidewalls of the openings 203a without forming on the interior sidewalls of the openings 203b. Furthermore, the insulation layer 216 is coated on the surface of the support substrate 202 further away from the multi-layer interconnection structure 206. The insulation layer 216 is fabricated using, for example, a material identical to the conventional solder mask layer.

Figure 2F:
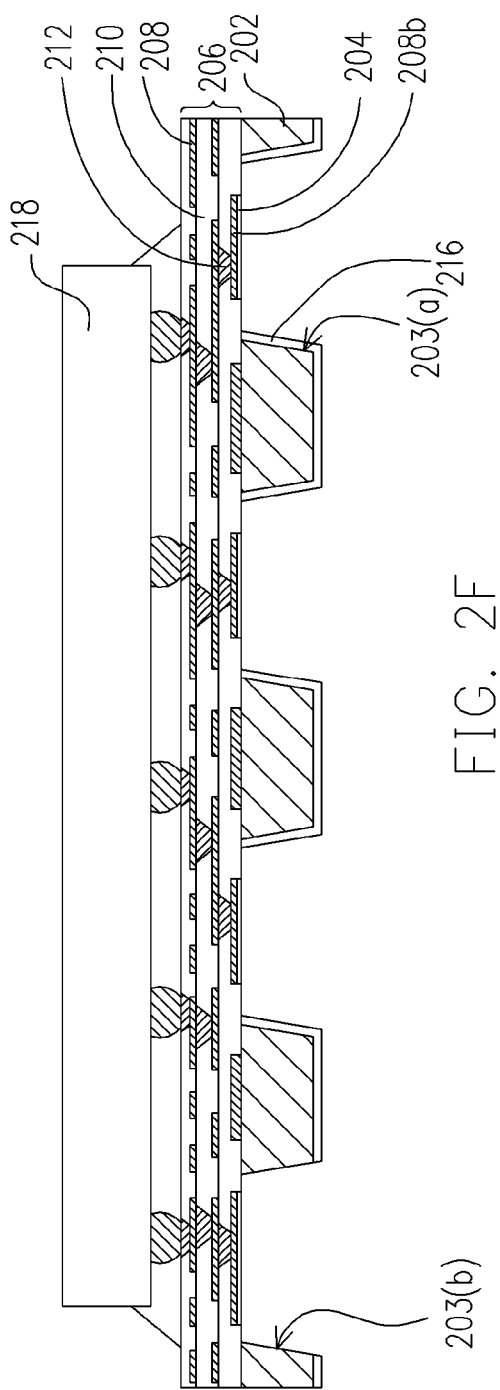

As shown in FIG. 2F, at least an electronic device 218 is attached to the top surface 206a of the multi-layer interconnection structure 206. Furthermore, the electronic device 218 is electrically connected to the inner circuits within the multi-layer interconnection structure 206. The electronic device 218 can be a die, a passive component or another electrical package. The method of linking the electronic device 218 to the multi-layer interconnection structure 206 electrically includes flip-chip bonding, wire bonding or thermal compression bonding. In the first embodiment, only the flip-chip bonding method of connecting a die electrically to the multi-layer interconnection structure 206 is shown.

Figure 2G:
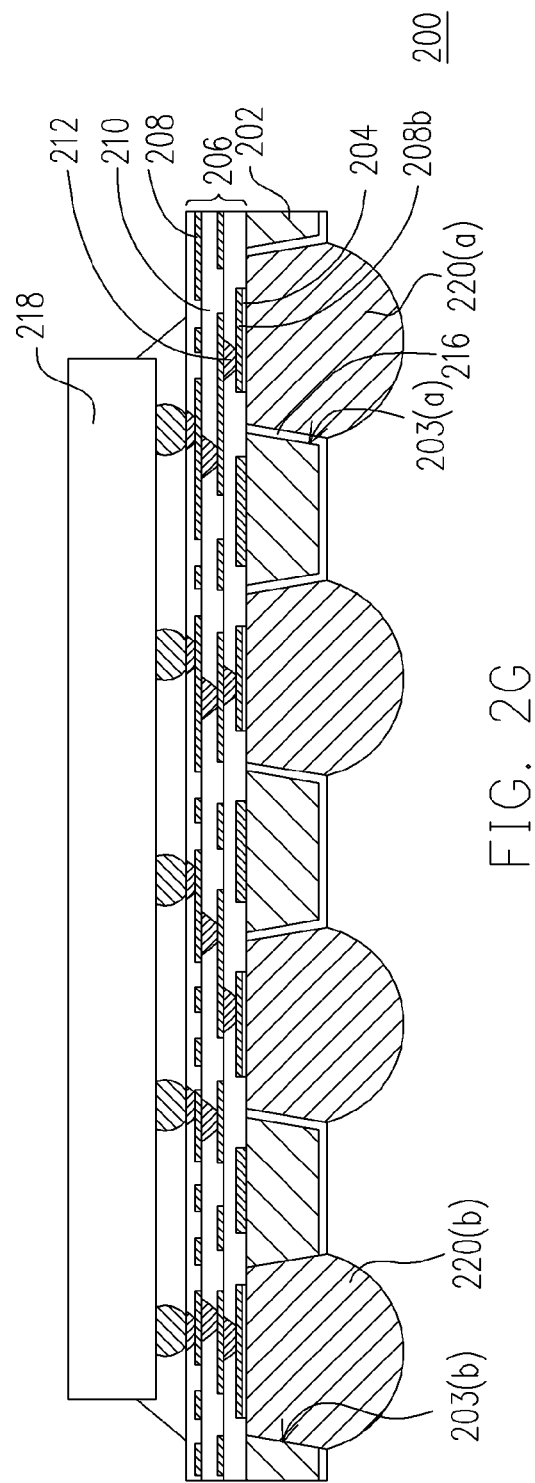

As shown in FIG. 2G, a contact 220 is formed over each bonding pad 208b. The contacts 220 are solder balls, pins or electrode blocks, for example. Thus, an electrical package 200 is fully formed. Note that the conductive support substrate 202 has a large surface area to serve as a large reference plane such as a power plane or a ground plane. Hence, the bottommost circuit layer 208 can be used to connect with the support substrate 202 directly. Furthermore, the contacts 220b (only one is shown) inside the openings 203b form directly electrical connections with the support substrate 202. Meanwhile, all the other contacts 220a have no electrical connection with the support substrate 202 because they are isolated from the support substrate 202 through the insulation layer 216. Hence, the electrical package 200 can have a larger reference plane for improving overall electrical performance.

To form solder balls contacts 220, material for forming the contacts 220 is deposited into the openings 203 to form electrical connections with corresponding bonding pads 208b. Furthermore, the singulation process for forming a plurality of single electrical packages 200 can be carried out before or after the contacts 220 are attached to the bonding pads 208b.

Figure 3:
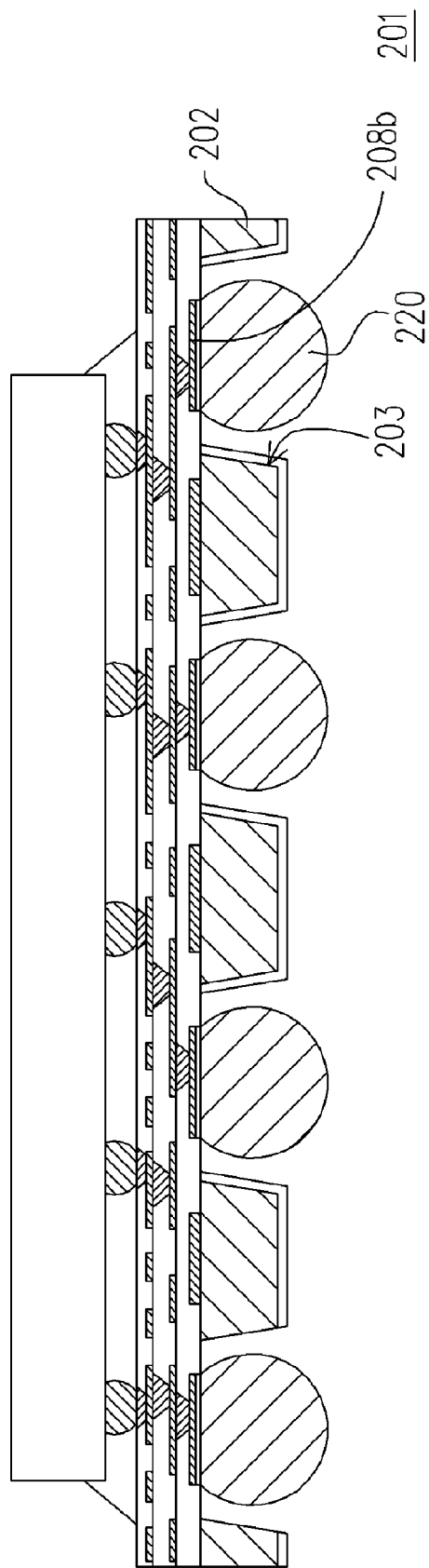
FIG. 3 is a schematic cross-sectional view of the electrical package according to the first preferred embodiment but having smaller size contacts.

FIG. 3 is a schematic cross-sectional view of the electrical package according to the first preferred embodiment but having contacts with smaller size. As shown in FIG. 3, the electrical package 201 is designed to have pin-shape or small size contacts 220. Since the contacts 220 will remain isolated as long as the contacts 220 are prevented from touching a corresponding opening 203, the contacts 220 are designed to have a smaller diameter than the openings 203. In other words, there is a minimum distance of separation between the side edges of the contacts 220 and the interior wall of the openings 203. Obviously, some of the contacts 220 may have a larger volume so that these particular contacts 220 can form a direct electrical connection with the support substrate 202 similar to the contacts 220b in FIG. 2G.

In the first embodiment, a circuit layer is formed over the support substrate before the remaining multi-layer interconnection structure. However, in a second embodiment, the remaining multi-layer interconnection structure is formed after forming an isolating layer with dielectric properties.

Figure 4A:
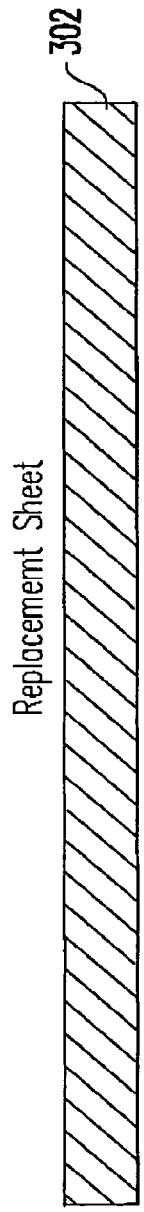

FIGS. 4A through 4H are schematic cross-sectional views showing the progression of steps for fabricating an electrical package according to a second preferred embodiment of this invention. As shown in FIG. 4A, a support substrate 302 fabricated using a high stiffness, electrical conductivity, thermal conductivity and a low coefficient of thermal expansion (CTE) material is provided. Material constituting the support substrate 302 includes iron, cobalt, nickel, copper, aluminum, titanium, tungsten, zirconium, chromium, an alloy of the above, AlSi, or AlSiC. Furthermore, the support substrate 302 must have a high degree of surface planarity to facilitate the subsequent fabrication of fine circuits.

Figure 4B:
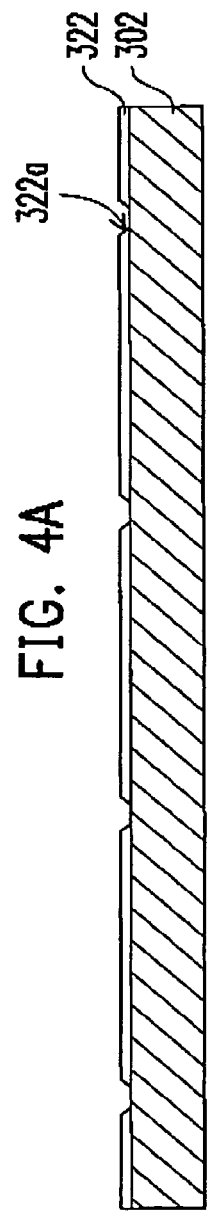

As shown in FIG. 4B, an isolating layer 322 is formed over the support substrate 302. Thereafter, a plurality of openings 322a is formed in the isolating layer 322. The isolating layer 322 is fabricated using a dielectric material.

Figure 4C:
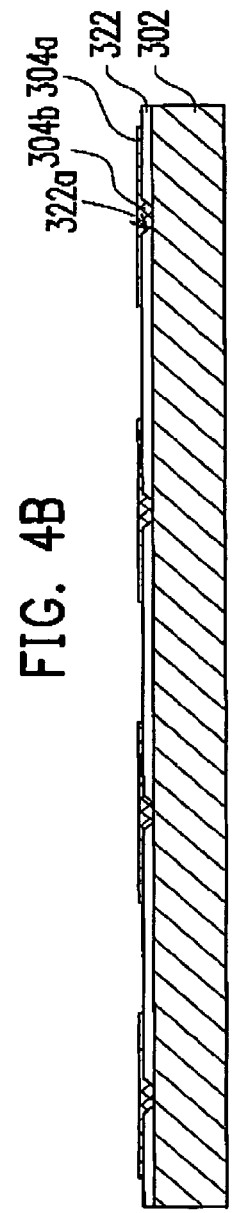

As shown in FIG. 4C, a patterned barrier layer 304a and a plurality of conductive vias 304b are formed over the support substrate 302. The barrier layer 304a is set up over the isolating layer 322 and the conductive vias 304b are set up inside various openings 322a. The barrier layer 304a and the conductive vias 304b are fabricated using a conductive material such as gold.

Figure 4D:
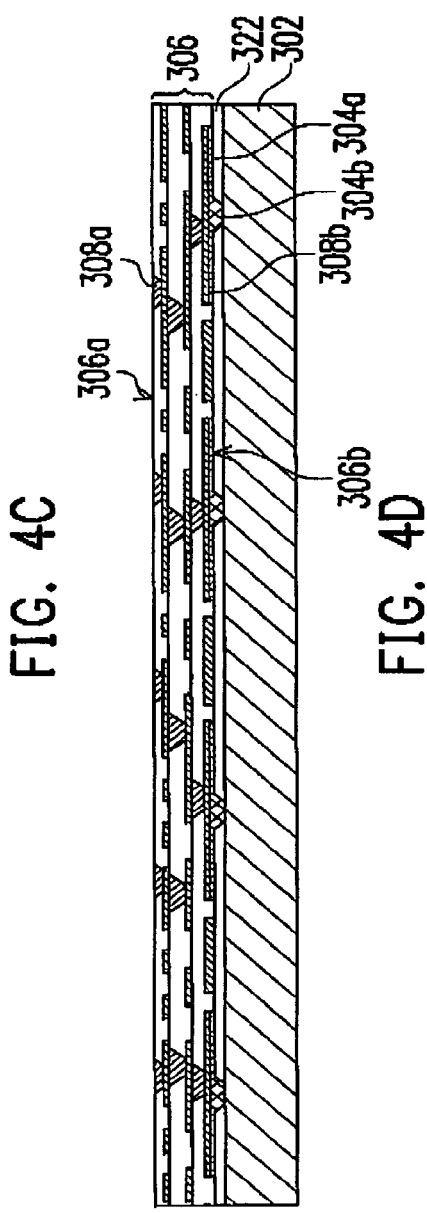

As shown in FIG. 4D, a multi-layer interconnection structure 306 is formed over the support substrate 302. Since the construction of the multi-layer interconnection structure 306 is identical to the one in the first embodiment, detailed description of the process is omitted. Similarly, a plurality of bonding pads 308a is formed on the top surface 306a of the multi-layer interconnection structure 306 and a plurality of bonding pads 308b is formed on the bottom surface 306b of the multi-layer interconnection structure 306. If the inner circuits within the multi-layer interconnection structure 306 are formed in an electroplating operation, the support substrate 302 and the conductive vias 304b may directly provide a conventional plating line function. In other words, the support substrate 302 and the conductive vias 304b may be directly connected to a power source that provides the plating current.

As shown in FIG. 4E, a portion of the support substrate 302 is removed to form a plurality of openings 303. Thereafter, a plurality of openings 323 is formed in the isolating layer 322 by ultrasonic drilling, laser burning or plasma etching. The openings 323 are linked to the various openings 303 so that the bonding pads 308a are indirectly exposed through The barrier layer 304a and the conductive vias 304b. Similarly, a pre-solder bump 314 (or a bump) may also be formed over the bonding pad 308a to facilitate flip chip bonding before the electronic device 318 is attached to the top surface 306a of the multi-layer interconnection structure 306. Note that the conductive support substrate 302 instead of a conventional plated line can be used to form various pie-solder bumps 314 on the bonding pads 308a of the multi-layer interconnection structure 306 by plating.

As shown in FIG. 4F, an insulation layer 316 is formed over the interior walls of the openings 303a and 323a but is prevented from forming on the interior walls of the openings 303b and 323b. Furthermore, the insulation layer 316 is coated on the surface of the support substrate 302 further away from the multi-layer interconnection structure 306. The insulation layer 316 is fabricated using, for example, a material identical to the conventional solder mask layer.

Figure 4G:
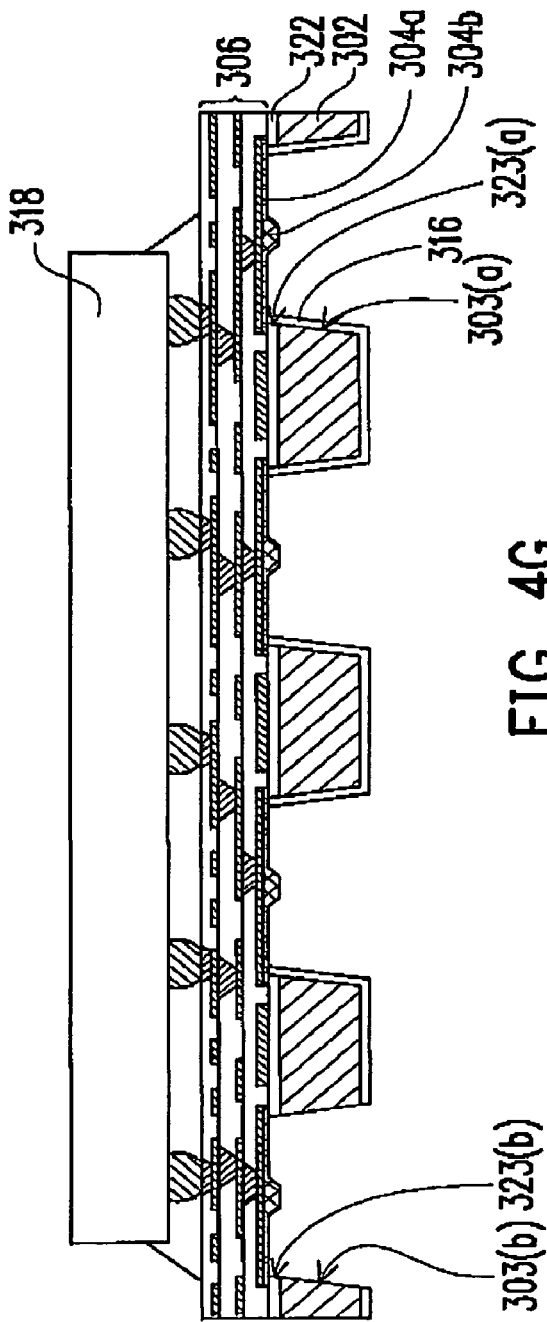

As shown in FIG. 4G, at least an electronic device 318 is attached to the top surface 306a of the multi-layer interconnection structure 306. Furthermore, the electronic device 318 is electrically connected to the inner circuits within the multi-layer interconnection structure 306. The electronic device 318 can be a die, a passive component or another electrical package. The method of linking the electronic device 318 to the multi-layer interconnection structure 306 electrically includes flip-chip bonding, wire bonding or thermal compression bonding. Similarly, in the second embodiment, only the flip-chip bonding method of connecting a die electrically to the multi-layer interconnection structure 306 is shown.

Figure 4H:
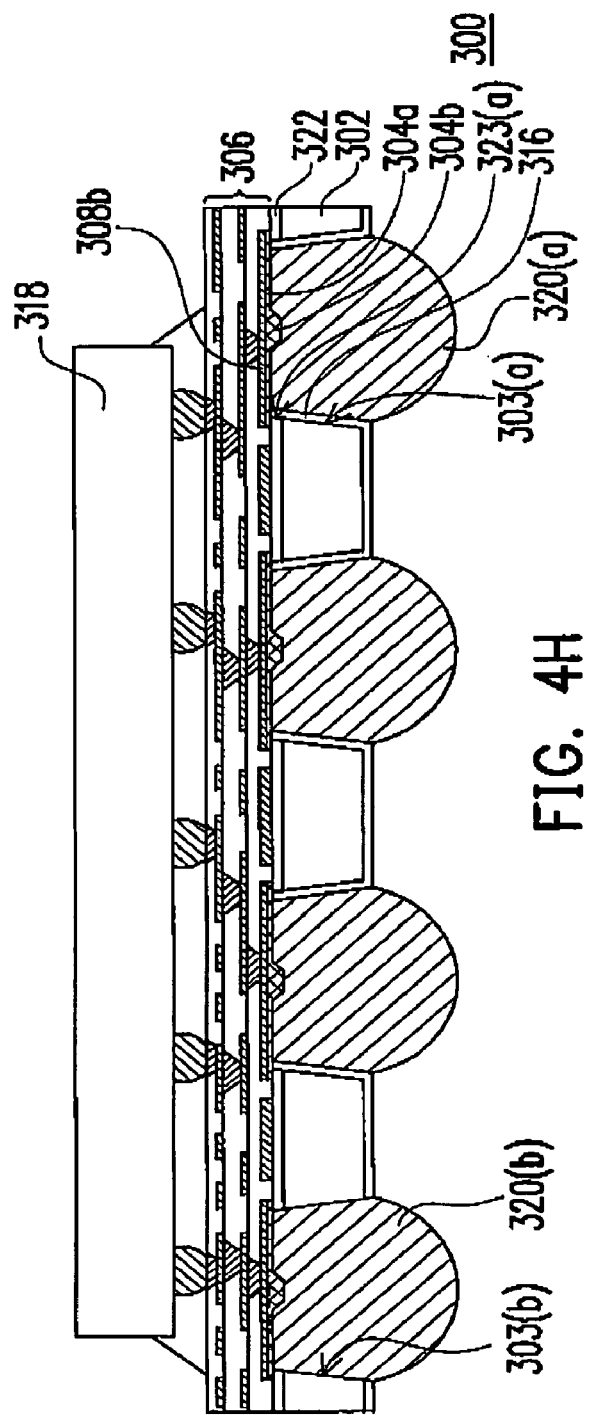

As shown in FIG. 4H, a contact 320 is formed over each bonding pad 308b. The contacts 320 are solder balls, pins or electrode blocks, for example. Thus, an electrical package 300 is fully formed. Similarly, the conductive support substrate 302 has a large surface area to serve as a large reference plane such as a power plane or a ground plane.

Hence, the contacts 320b (only one is shown) inside the openings 303b can be used for connecting with the support substrate 302. Meanwhile, other contacts 320a having not need for any electrical connection with the support substrate 302 are electrically isolated from the support substrate 302 through the insulation layer 316. Consequently, the electrical package 300 can have a larger reference plane for improving overall electrical performance.

To form solder balls contacts 320, material for forming the contacts is deposited into the openings 303 to form electrical connections with corresponding bonding pads 308b. Furthermore, the singulation process for forming a plurality of single electrical packages 300 can be carried out before or after the contacts 320 are attached to the bonding pads 308b.

Aside from packaging single electronic device, the electrical package according to the first and second embodiment of this invention can be used to enclose a multiple of electronic devices. Through the inner circuits within the multi-layer interconnection structure, various electronic devices are connected electrically. In other words, the electrical packages can be applied to form a multi-chip module (MCM) and system in package (SIP) module.

In summary, major advantages of the electrical package and manufacturing method thereof according to this invention includes:

1. A support substrate with a high stiffness, good electrical conductivity and low coefficient of thermal expansion is used as an initial layer in the fabrication so that warpage of electrical package is greatly reduced.

2. The electrically conductive support substrate can serve as the power plane or the ground plane of the electrical package and connections with the support substrate can be effected through contacts. Hence, electrical performance of the electrical package is improved.

3. Since the support substrate has a high thermal conductivity, overall heat-dissipation capacity of the electrical package is improved.

4. Compared with a conventional substrate with a dielectric core, this invention has no need for drilling fine holes to fabricate plated through holes (PTH). Thus, the wiring density inside the multi-layer interconnection structure can be increased to provide better performance.

5. In the second embodiment of this invention, the conductive support substrate replaces the conventional plated line. Furthermore, through the support substrate, an electroplated layer and a pre-solder bump are formed on the bonding pads on the top surface of multi-layer interconnection structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. An electrical package comprising:
 a multi-layer interconnection structure having a top surface, a bottom surface and an inner circuit therein, wherein the inner circuit has a plurality of bonding pads on the bottom surface of the multi-layer interconnection structure;
 at least an electronic device positioned on the top surface of the multi-layer interconnection structure and electrically connected to the inner circuit of the multi-layer interconnection structure;
 a support substrate made from a conductive material, wherein the support substrate is positioned on the bottom surface of the multi-layer interconnection structure, and the support substrate has a plurality of first openings, each first opening exposing one of the corresponding bonding pads; and
 an insulation layer covering the support substrate and exposing the bonding pads.

2. The electrical package of claim 1, further comprising a patterned barrier layer covering the bonding pads and exposed by the first openings.

3. The electrical package of claim 1, wherein the electronic device comprises a die, a passive component or an electrical package.

4. The electrical package of claim 1, wherein material constituting the support substrate comprises a metallic material or an alloy.

5. The electrical package of claim 1, wherein the package further comprises a plurality of contacts connected to various bonding pads through corresponding first openings.

6. The electrical package of claim 5, wherein the contacts are configured as solder balls, pins or electrode blocks.

7. The electrical package of claim 5, wherein at least one of the contacts completely fills the first opening so that the contact is electrically connected to the support substrate.

8. The electrical package of claim 1, wherein the insulation layer exposes a sidewall of at least one of the first openings.

9. The electrical package of claim 1, the package further comprises a solder mask layer disposed over a sidewall of at least one of the first openings.

10. The electrical package of claim 1, wherein the electronic device is electrically connected to the inner circuit within the multi-layer interconnection structure through flip-chip bonding, wire-bonding or a thermal pressure bonding.

11. The electrical package of claim 1, further comprising a patterned barrier layer and a plurality of conductive vias, the patterned barrier layer covering the bonding pads and the conductive vias disposing on the patterned barrier layer, wherein the patterned barrier layer and the conductive vias are exposed by the first openings.

12. The electrical package of claim 11, further comprises a plurality of contacts, each contact electrically connecting to one of the conductive vias and the patterned barrier layer, such that the contacts are electrically connected to the bonding pads through the patterned barrier layer and the conductive vias.

* * * * *